US011301008B2

(12) United States Patent
Adami et al.

(10) Patent No.: US 11,301,008 B2
(45) Date of Patent: Apr. 12, 2022

(54) COOLED ELECTRONIC CIRCUIT BOARD

(71) Applicant: Eurotech S.p.A., Amaro (IT)

(72) Inventors: Stefano Adami, Amaro (IT); Mauro Rossi, Amaro (IT)

(73) Assignee: Eurotech S.p.A., Amaro (IT)

(\*) Notice: Subject to any disclaimer, the term of this patent is extended or adjusted under 35 U.S.C. 154(b) by 0 days.

(21) Appl. No.: 16/344,360

(22) PCT Filed: Oct. 23, 2017

(86) PCT No.: PCT/IT2017/000232
§ 371 (c)(1),
(2) Date: Apr. 24, 2019

(87) PCT Pub. No.: WO2018/078664
PCT Pub. Date: May 3, 2018

(65) Prior Publication Data
US 2019/0272009 A1    Sep. 5, 2019

(30) Foreign Application Priority Data

Oct. 24, 2016   (IT) .................. 102016000106718

(51) Int. Cl.
*H05K 7/20*      (2006.01)
*G06F 1/20*      (2006.01)
*H05K 1/14*      (2006.01)

(52) U.S. Cl.
CPC ............ *G06F 1/203* (2013.01); *H05K 1/141* (2013.01); *H05K 7/2029* (2013.01); *H05K 7/2039* (2013.01); *G06F 2200/201* (2013.01)

(58) Field of Classification Search
CPC . G06F 1/203; G06F 2200/201; H05K 7/2029; H05K 1/141; H05K 7/2039

(Continued)

(56) References Cited

U.S. PATENT DOCUMENTS 5,710,693 A \* 1/1998 Tsukada .................. G06F 1/16
361/679.32
5,892,660 A \* 4/1999 Farnworth ............. H01R 12/83
361/728

(Continued)

FOREIGN PATENT DOCUMENTS

GB       2496481       5/2013
WO    WO 2018/078664   5/2018

OTHER PUBLICATIONS

International Search Report and the Written Opinion dated Feb. 9, 2018 From the International Searching Authority Re. Application No. PCT/IT2017/000232. (13 Pages).

(Continued)

*Primary Examiner* — Anatoly Vortman

(57) ABSTRACT

A cooled electronic circuit board (10) comprising:
  a support circuit board (11) equipped with sockets (12*a*, 12*b*, 12*c*) mutually alongside each other for DIMM storage modules (13);
  DIMM storage modules (13) each equipped with a plug (14) which can be coupled with one of the sockets (12*a*, 12*b*, 12*c*);
  two supports (15, 16) for storage modules (13), having respective channels (17) for the passage of a cooling liquid;
  thermal conduits (18) connected to the channels (17), each located between two adjacent sockets (12*a*, 12*b*, 12*c*) of the support circuit board (11);
  heat diffusers (19) each equipped with two walls (20, 21) each covering a side of one of the storage modules (13).
The heat diffusers (19) are designed in such a way that, in use, two of the adjacent heat diffusers are in mutual thermal contact and in thermal contact with the thermal conduits (18) and with the supports (15, 16).

9 Claims, 2 Drawing Sheets

(58) Field of Classification Search
USPC ......... 257/707, 719; 361/702, 707, 709–711, 361/715, 719, 720, 679.54, 699
See application file for complete search history.

(56) References Cited

U.S. PATENT DOCUMENTS

| | | | | | |
|---|---|---|---|---|---|
| 5,896,274 | A * | 4/1999 | Ishida | ................. | H05K 5/0269 361/737 |
| 6,119,765 | A * | 9/2000 | Lee | ................. | G11C 5/00 165/185 |
| 6,233,150 | B1 * | 5/2001 | Lin | ................. | H05K 9/0039 165/185 |
| 6,269,001 | B1 * | 7/2001 | Matteson | ................. | H01L 23/4093 165/80.3 |
| 6,377,460 | B1 * | 4/2002 | Pohl | ................. | H01L 23/3677 165/80.3 |
| 6,496,375 | B2 * | 12/2002 | Patel | ................. | H01L 23/3675 165/104.33 |
| 7,023,700 | B2 * | 4/2006 | Chiou | ................. | H01L 23/3672 257/E23.083 |
| 7,215,551 | B2 * | 5/2007 | Wang | ................. | H01L 23/3672 257/707 |
| 7,345,882 | B2 * | 3/2008 | Lee | ................. | H01L 23/3672 257/719 |
| 7,349,219 | B2 * | 3/2008 | Lai | ................. | H01L 23/4093 165/185 |
| 7,349,220 | B2 * | 3/2008 | Lai | ................. | H01L 23/4093 165/185 |
| 7,382,617 | B2 * | 6/2008 | Yu | ................. | H01L 23/4093 165/185 |
| 7,408,776 | B2 * | 8/2008 | Campbell | ................. | H01L 23/473 361/699 |
| 7,443,023 | B2 * | 10/2008 | Wehrly, Jr. | ................. | H05K 1/189 257/707 |
| 7,609,523 | B1 * | 10/2009 | Ni | ................. | H01L 23/3672 257/707 |
| 7,755,897 | B2 * | 7/2010 | Chen | ................. | H01L 23/427 257/709 |
| 7,768,785 | B2 * | 8/2010 | Ni | ................. | H01L 23/367 257/707 |
| 7,911,798 | B2 * | 3/2011 | Chang | ................. | H01L 23/3672 257/709 |
| 7,957,134 | B2 * | 6/2011 | Farnsworth | ................. | H01L 23/4093 257/719 |
| 7,969,736 | B1 * | 6/2011 | Iyengar | ................. | H01L 23/36 165/104.33 |
| 8,004,841 | B2 * | 8/2011 | Cipolla | ................. | F28D 15/0233 165/104.33 |
| 8,059,403 | B2 * | 11/2011 | Chou | ................. | H01L 23/467 361/694 |
| 8,248,805 | B2 * | 8/2012 | Brandon | ................. | H01R 12/7029 257/707 |
| 8,385,069 | B2 * | 2/2013 | Iyengar | ................. | G06F 1/20 165/80.4 |
| 8,570,744 | B2 * | 10/2013 | Rau | ................. | G06F 1/20 361/679.52 |
| 8,587,943 | B2 * | 11/2013 | Barina | ................. | H01L 23/427 165/104.33 |
| 8,638,559 | B2 * | 1/2014 | Barina | ................. | H01L 23/4093 165/104.21 |
| 8,659,897 | B2 * | 2/2014 | Meijer | ................. | G06F 1/20 361/679.32 |
| 2002/0039282 | A1 * | 4/2002 | Han | ................. | G11C 5/04 361/719 |
| 2003/0026076 | A1 * | 2/2003 | Wei | ................. | H01L 23/36 361/704 |
| 2004/0130873 | A1 * | 7/2004 | Hsueh | ................. | G06F 1/184 361/697 |
| 2004/0250989 | A1 * | 12/2004 | Im | ................. | H01L 23/4093 165/80.1 |
| 2005/0141199 | A1 * | 6/2005 | Chiou | ................. | H01L 23/3672 361/704 |
| 2005/0276021 | A1 * | 12/2005 | Gates | ................. | H01L 23/3672 361/709 |
| 2006/0056154 | A1 * | 3/2006 | Foster | ................. | G06F 1/185 361/700 |
| 2006/0203454 | A1 * | 9/2006 | Chang | ................. | H01L 23/3672 361/707 |
| 2006/0250772 | A1 * | 11/2006 | Salmonson | ................. | G06F 1/20 361/698 |
| 2007/0195489 | A1 * | 8/2007 | Lai | ................. | G11C 5/143 361/600 |
| 2007/0223198 | A1 * | 9/2007 | Lai | ................. | H01L 23/3672 361/720 |
| 2007/0263360 | A1 * | 11/2007 | Lai | ................. | H01L 23/4093 361/719 |
| 2008/0013282 | A1 * | 1/2008 | Hoss | ................. | H01L 23/4093 361/715 |
| 2008/0062652 | A1 * | 3/2008 | Lieberman | ................. | H01L 23/427 361/715 |
| 2008/0101036 | A1 * | 5/2008 | Chen | ................. | H01L 23/4093 361/720 |
| 2009/0129026 | A1 * | 5/2009 | Baek | ................. | H01L 23/3672 361/710 |
| 2009/0190303 | A1 * | 7/2009 | Chu | ................. | G06F 1/20 361/679.47 |
| 2009/0237883 | A1 * | 9/2009 | Wei | ................. | G06F 1/20 361/699 |
| 2009/0277616 | A1 | 11/2009 | Cipolla et al. | | |
| 2010/0085712 | A1 * | 4/2010 | Hrehor, Jr. | ................. | H05K 7/20254 361/699 |
| 2012/0020022 | A1 * | 1/2012 | Peterson | ................. | G06F 1/20 361/699 |
| 2012/0113586 | A1 * | 5/2012 | Rau | ................. | G06F 1/20 361/679.47 |
| 2014/0192476 | A1 * | 7/2014 | Chainer | ................. | H05K 7/20009 361/679.31 |

OTHER PUBLICATIONS

Rapporto di Ricerca e Opinione Scritta [Search Report and Written Opinion] dated Jun. 30, 2017 From the Ministero Dello Sviluppo Economico, Direzzione Generale Produttivo e Competitivita. Ufficio Italiano Brevetti e Marchi Re. Application No. IT201600106718. (9 Pages).

* cited by examiner

COOLED ELECTRONIC CIRCUIT BOARD

RELATED APPLICATIONS

This application is a National Phase of PCT Patent Application No. PCT/IT2017/000232 having International filing date of Oct. 23, 2017, which claims the benefit of priority of Italian Patent Application No. 102016000106718 filed on Oct. 24, 2016. The contents of the above applications are all incorporated by reference as if fully set forth herein in their entirety.

FIELD AND BACKGROUND OF THE INVENTION

This invention relates to a cooled electronic circuit board.

In particular, this invention relates to an electronic circuit board comprising a plurality of DIMMs which especially are ULP DIMMs.

The term ULP DIMMs means dual-in-line storage modules with an ultra low profile, having a height of less than 18 mm.

There is a need in the field of electronic circuit boards for electronic super-processors which increase the processing and storage capacity of electronic circuit boards with the same overall size and increase the output density per circuit board and per system.

More specifically, there is a need to increase the integration of electronic processing circuit boards w shaped to be installed vertically with the longest side in the insertion/removal direction and to be connected to a system through a backplane. This is required for reducing a space defined between such circuit boards.

According to the state of the art, the DIMM storage modules housed perpendicularly to the electronic circuit board constitute the main height dimension of the electronic circuit board which therefore determines the minimum size which can be obtained, the integration which can be achieved.

The addition of liquid cooling systems for the storage modules generally further increases the overall height of the circuit board.

The aim of increasing the capacity of the electronic circuit boards, with the same overall volume, is obstructed by the need to guarantee a sufficient removal of the heat generated by the storage modules in order not to damage them.

In view of the density of thermal power generated by these storage modules, a cooling by forced convection using a cooling liquid is currently commonly used.

More specifically, prior art electronic circuit boards are made which have a support circuit board equipped with a plurality of sockets for storage modules and two opposite blocks, each facing one of the longitudinal ends of the storage modules which, in use, engage the sockets.

These blocks are crossed by a channel in which a cooling fluid flows and they are mutually connected by cooling thermal conduits in communication with the channels inside the blocks.

These cooling thermal conduits extend on the support circuit board, each between two adjacent sockets, and their size above the support circuit board is such as to leave a free space, between two adjacent storage modules, large enough to be gripped by the user.

Each storage module is fitted with a heat diffuser consisting of a thin sheet shaped in the form of a "U".

The dissipaters have an edge bent in the shape of an "L" designed to enter into contact with the cooling thermal conduits to exchange heat with them.

The dissipaters are compressed against the modules by metal springs.

Both the springs and the dissipaters are thin so as not to obstruct the gripping by hand of the modules on which they are mounted.

The intention of this invention is to increase the cooling efficiency per unit of volume of an electronic circuit board.

SUMMARY OF THE INVENTION

The main aim of this invention is to make a cooled electronic circuit board which resolves this problem.

The aim of this invention is to provide a cooled electronic circuit board with the same thermal output removed allowing the overall dimensions to be reduced.

Another aim of this invention is to make a cooled electronic circuit board which allows a cooperation of the diffusers of adjacent storage boards, in the removal of heat from the latter.

Another aim of the invention is to provide a cooled electronic circuit board which is as easily assembled and dismantled as that of the traditional electronic circuit board described above.

This aim, is attained by a cooled electronic circuit board according to appended claim 1.

BRIEF DESCRIPTION OF THE SEVERAL VIEWS OF THE DRAWINGS

Further features and advantages of the invention will emerge more fully from the description of a preferred but not exclusive embodiment of a cooled electronic circuit board, illustrated by way of non-limiting example in the accompanying drawings, in which.

DESCRIPTION OF SPECIFIC EMBODIMENTS OF THE INVENTION

Figure 1:
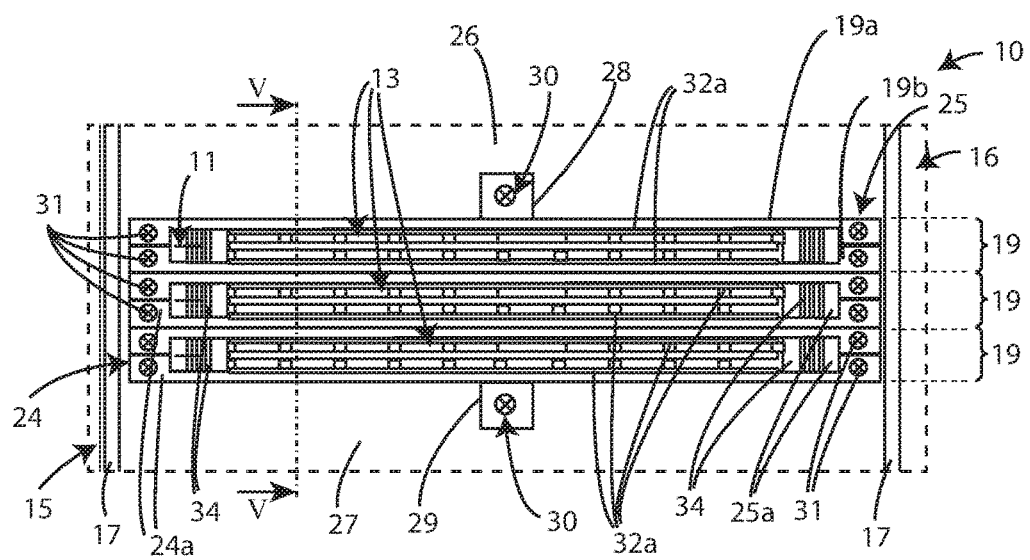
FIG. 1 is a view from above of an electronic circuit board according to the invention.
Figure 2:
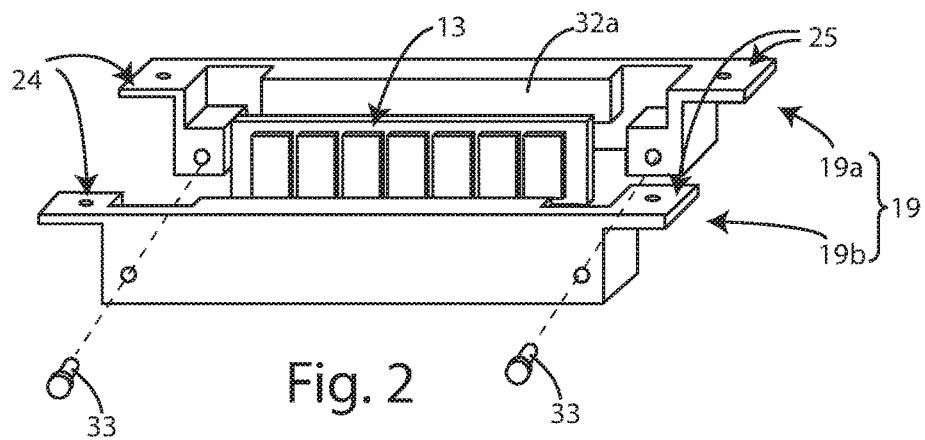
FIG. 2 illustrates an exploded view of a detail of the electronic circuit board of FIG. 1, relative to a storage module and a heat diffuser.
Figure 3:
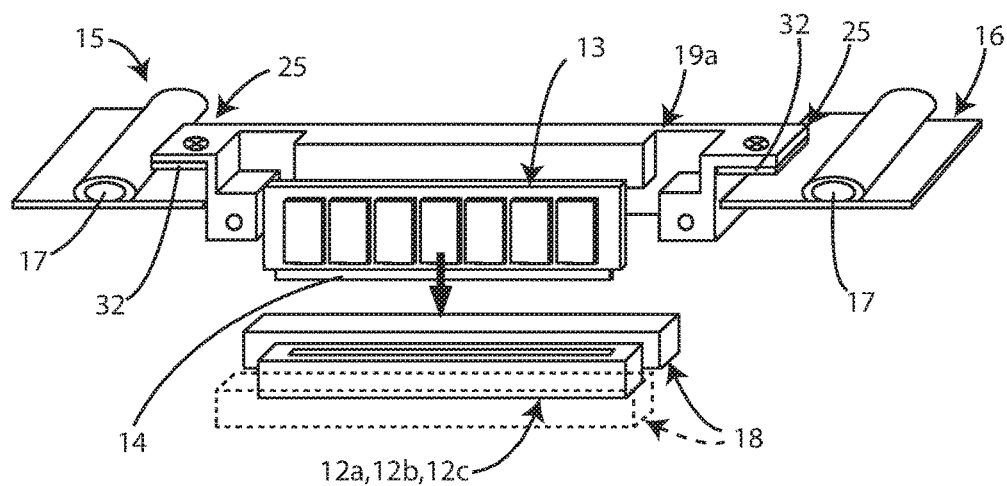
FIGS. 3 and 4 illustrate a storage module assembled with the respective heat diffuser, in two respective assembly steps on the support circuit board, with some parts removed to better highlight others.
Figure 4:
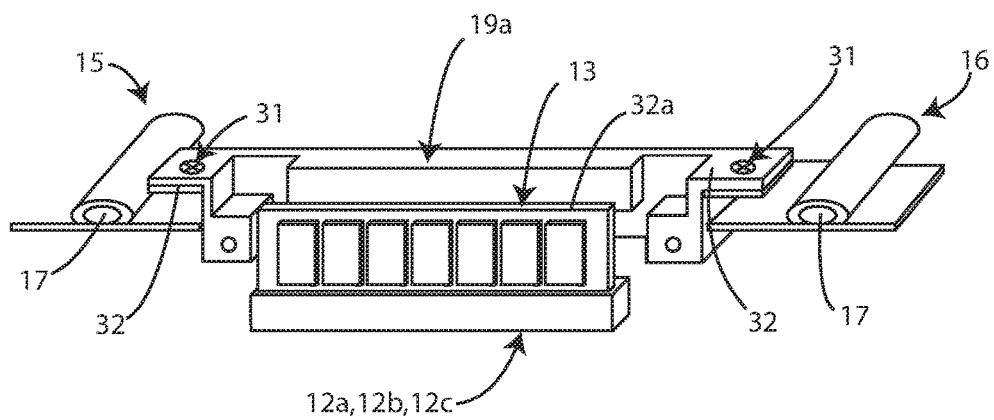
Figure 5:
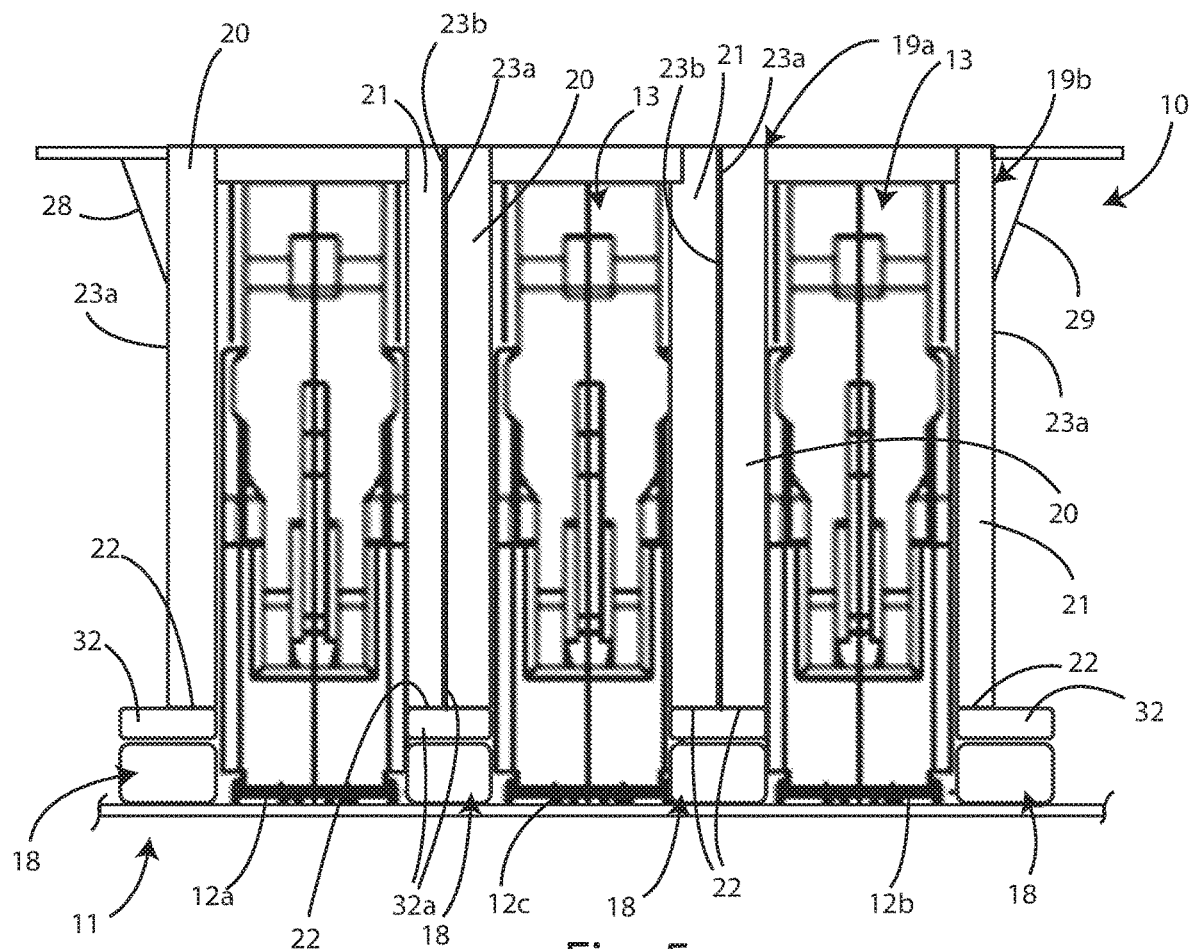
FIG. 5 is a simplified diagram of the electronic circuit board of FIG. 1 along cross-section V-V.

With particular reference to the above-mentioned drawings, the numeral 10 denotes in its entirety a cooled electronic circuit board comprising:

- a support circuit board 11 equipped with sockets 12a, 12b, 12c mutually alongside each other for DIMM storage modules 13;
- DIMM storage modules 13 each equipped with a plug 14 which can be coupled with one of the sockets 12a, 12b, 12c;
- two supports 15, 16, having respective channels 17 for the passage of a cooling liquid;
- preferably, but not necessarily, thermal conduits 18 which are connected thermally to the supports 15, 16, and each is located between two adjacent sockets 12a, 12b, 12c of the support circuit board 11;

heat diffusers 19 each equipped with two walls 20, 21 each covering a side of one of the storage modules 13 to dissipate heat.

The supports 15 and 16 being designed to support the storage modules 13 and the relative heat diffusers 19.

The heat diffusers 19 have:

advantageously, but not necessarily, a lower face 22 which is in contact with the thermal conduits 18 adjacent to the plug 14 of the support circuit board 11 to which the storage module 13 is coupled;

side faces 23a, 23b, which are in direct thermal contact or, preferably, indirect as described in detail below, with thermal conduits 18 for dissipating heat.

The heat diffusers 19 are designed in such a way that, in use, two adjacent heat diffusers 19 are in mutual thermal contact by means of the respective side faces 23a, 23b.

Moreover, the heat diffusers 19 have two opposite longitudinal ends 24, 25 each in thermal contact with one of the supports 15, 16, for dissipating heat through the latter. In other words, the heat diffusers 19 are configured in such a way that, when they are coupled with the storage modules 13, they each have relative walls 20 and 21 in thermal contact with walls 20 and 21 of heat diffusers 19 coupled with the directly adjacent storage modules 13, unless, clearly in the case of the head storage modules, they have a single adjacent storage module and the thermal diffuser therefore has a single wall in contact with that of the adjacent thermal diffuser.

In a preferential embodiment, the thermal conduits 18 consist of copper pipes in direct contact with the channels 17 in which the cooling liquid circulates.

In another preferred embodiment, the thermal conduits 18 consist of heat-pipes suitably shaped at the ends for connecting mechanically and thermally to the single supports 15 and 16, and cooled by the proximity of the channels 17.

An electronic circuit board 10 according to this invention thereby allows the dissipation of the heat generated by the electronic components of the storage modules 13 to be optimised, allowing, in particular, a collaboration between heat diffusers 19 coupled to the adjacent storage modules.

Indeed, the fact that the heat diffusers 19 which are coupled to adjacent storage modules 13 are in mutual thermal contact has the effect that a first heat diffuser 19, which is coupled to a first storage module 13, will be able to dissipate a part of the heat generated by a second storage module 13, adjacent to the first, and transmitted to it from the second heat diffuser 19 with which it is in thermal contact and which is coupled with the second storage module 13.

The thermal conduits 18 can, for example, be made in the form of pipes connected hydraulically to the channels 17 for being passed through, in use, by the cooling liquid. Alternatively, the thermal conduits can be made by means of the devices generally known as "heat pipes", that is, in the form of closed tubular elements and made from a thermo-conductive metal, typically copper, containing a small quantity of a cooling fluid such as, for example, water, ethanol or mercury which is in part in a liquid form and in part in a vapour form, in such a way that no other gases are present.

The heat pipe will transfer heat from a hot end to the other cold end, by means of the evaporation and condensation of the cooling fluid.

In order to increase the efficiency of thermal contact, close to the supports 15 and 16, between the mutually adjacent heat diffusers 19 and between the heat diffusers 19 and the respective storage modules 13 on which they are mounted, the electronic circuit board 10 preferably comprises pushing means for compressing the heat diffusers 19 one against the other.

The sockets 12a, 12b, 12c of the support circuit board 11 are advantageously arranged in such a way as to comprise two head sockets 12a, 12b and intermediate socket 12c.

The sockets 12a, 12b, 12c form a series and are mutually aligned between the head sockets 12a, 12b.

The head sockets 12a and 12b define head positions for the storage modules 13.

In a preferred but non-limiting embodiment, the electronic circuit board 10 advantageously comprises two containment elements 26, 27 fixed to the support circuit board 11 and each adjacent one to one of the head sockets 12a, 12b.

Advantageously, in this preferred embodiment, the pushing means comprise wedge-shaped elements 28, 29 configured for being inserted between one of the containment elements 26, 27 and one of the heat diffusers 19 which is coupled to one of the storage modules 13 in a head position.

Preferably, there are first threaded elements 30 which are designed to fix the wedge-shaped or L-shaped elements 28, 29 to the containment elements 26, 27.

For this purpose, the first threaded elements 30 are preferably screws with countersunk heads which can be screwed into a threaded seat of the containment elements and can be inserted through a through hole of the wedge-shaped elements 28 and 29.

According to another possible embodiment, the pushing means comprise L-shaped elements positioned in such a way as to achieve the compression once inserted.

The electronic circuit board 10 is advantageously configured in such a way that following a modulation of the screwing of the second threaded elements 30 the compaction pushing of the heat diffusers 19 is adjusted.

Preferably, the pushing elements 28, 29 are positioned at the centre of the storage module, this being the furthest point from the cooled supports 15 and 16 and also the most critical to be cooled.

The wedge-shaped or L-shaped elements 28, 29 are preferably made of aluminium or copper. The wedge-shaped or L-shaped elements 28, 29 compact the central part due to the structure of the heat diffuser 19. The cooled containment elements 26 and 27 increasing the dissipation of heat especially in the central zone.

In other words, the containment elements 26 are 27 are cooled as they are connected to the support circuit board 11 and compact the heat diffusers 19, preferably by means of the wedge-shaped or L-shaped elements 28, 29 which push on the heat diffusers 19 advantageously in their central zone, thereby increasing the heat dissipation.

Preferably, the heat diffusers 19 are configured in such a way that the space between the electronic components of two adjacent storage modules 13 is occupied completely by the walls 20, 21 of two adjacent heat diffusers 19, which are respectively coupled to the adjacent storage modules 13.

In this way it is possible, with an electronic circuit board 10 according to this invention, that the space between two adjacent storage modules 13 is in fact completely filled by the heat diffusers so as to prevent the presence of air which would create a thermal insulation effect between the heat diffusers. As described, the elements 28 and 29 contribute further to this aim.

A traditional electronic circuit board is provided with spaces between modules thereof and between ends of a module and the side support elements. In such a manner, traditional electronic circuits can to be gripped by hand. This is guaranteed also in an electronic circuit board according to this invention by the particular configuration of the heat diffusers 19, as will be described in more detail below.

Advantageously, the electronic circuit board 10 comprises compression means designed to push the heat diffusers 19 against the thermal conduits 18 to render the thermal conduction between more efficient.

These compression means preferably comprise second threaded elements 31 designed to fix the heat diffusers 19 to the supports 15, 16.

In more detail, the compression means preferably comprise screws which can be inserted through holes of the longitudinal ends of the heat diffusers 19 and which can be engaged in threaded seats provided in the supports 15 and 16.

Preferably, the electronic circuit board 10 is configured to gradually tighten the second threaded elements on the supports 15 and 16. This tightening induces a gradual compression of the heat diffusers 19 against the thermal conduits 18, so as to adjust a degree of contact between these.

In order to increase the efficiency of thermal transmission the electronic circuit board 10 preferably comprises thermally conductive mats 32 which can be deformed to operate in compression, preferably positioned between the walls 20, 21 and the thermal conduits 18, to improve the thermal transmission between them.

Advantageously, between the walls 20, 21 of adjacent thermal dissipaters 19 there is a filling element 32a, preferably consisting of a sheet of ultra-thin graphite, which is designed to further dissipate the heat from the centre of each surface 23a and 23b from where it may be less efficiently removed, towards the rest of the two adjacent heat diffusers 19.

According to a preferred embodiment of the invention, the supports 15, 16 comprise a plate passed through internally by the channels 17 and/or heat exchangers of the roll-bond type.

The heat diffusers 19 preferably consist of two complementary bodies 19a, 19b configured to be coupled in such a way as to define between them a cavity designed to house one of the storage modules 13.

The bodies 19a, 19b are in mutual thermal contact at least at the longitudinal ends 24, 25 and are preferably connected by means of screws 33 so as to be able to adjust the pressure exerted by them on the storage module.

In order to optimise the dimensions of the electronic circuit board 10, the heat diffusers 19 advantageously do not non protrude in height from the support circuit board more than the storage modules 13 so as not to increase the height.

Advantageously, the longitudinal ends 24 and 25 of the heat diffusers 19 define recesses 24a and 25a in which are housed fixing clips 34, associated with the sockets 12a, 12b, 12c, which define the standard mechanism for fixing traditional DIMM modules.

In this way, a cooled electronic circuit board according to this invention is easier to dismantle and/or assemble. It is also highly integrated in the direction of longitudinal extension of the storage modules and, therefore, the overall size is kept to a minimum.

An electronic circuit board according to the invention achieves the set aims and objectives.

More specifically, with the same cooling capacity and configuration of the storage modules, the cooled electronic circuit board according to this invention is compact in all dimensions.

It is in fact more compact than the traditional cooled circuit boards equipped with conduits for cooling fluid.

Moreover, in height, the size is exactly that of the storage modules since it is not in need of anything which superposes them, which, on the other hand, is the case with traditional circuit boards which have clips mounted on the storage modules to retain the heat diffusers.

In width, a cooled circuit board according to this invention achieves an optimum packaging with respect to traditional solutions.

A cooled circuit board according to this invention also allows the heat generated by a module to be dispersed towards the dissipating elements associated with the adjacent storage modules, when there is a negative thermal gradient with respect to an adjacent module. This may be due to a greater use (greater thermal output) of the module in question to be cooled, or more complex thermal dynamics which involve several storage modules and the relative dissipaters.

The invention as it is conceived is susceptible to numerous modifications and variants, all falling within the scope of protection of the appended claims.

Further, all the details can be replaced by other technically-equivalent elements.

In practice, the materials used, as well as the contingent forms and dimensions, can be varied according to the contingent requirements and the state of the art.

Where the constructional characteristics and the technical characteristics mentioned in the following claims are followed by signs or reference numbers, the signs or reference numbers have been used only with the aim of increasing the intelligibility of the claims themselves and, consequently, they do not constitute in any way a limitation to the interpretation of each element identified, purely by way of example, by the signs or reference numerals.

The invention claimed is:

1. A cooled electronic circuit board (10) comprising:
   a support circuit board (11) equipped with sockets (12a, 12b, 12c) mutually alongside each other for DIMM storage modules (13);
   DIMM storage modules (13) each equipped with a plug (14) which can be coupled with one of the sockets (12a, 12b, 12c);
   two supports (15, 16), having respective channels (17) for the passage of a cooling liquid;
   heat diffusers (19) each equipped with two walls (20, 21) each covering a side of one of the storage modules (13) for absorbing heat;
   thermal conduits (18) which are in thermal contact with the supports (15, 16), each of the thermal conduits (18) is located between two adjacent sockets (12a, 12b, 12c) of the support circuit board (11);
   wedge-shaped or L-shaped elements (28, 29) for compressing the heat diffusers (19) against one another
   wherein a lower face (22) of each of the heat diffusers (19) is in contact with the thermal conduits (18) adjacent to one of the sockets (12a, 12b, 12c) of the support circuit board (11);
   wherein in use two of the adjacent heat diffusers (19) are in thermal contact by respective side faces (23a, 23b);
   wherein the heat diffusers (19) having two opposite longitudinal ends (24, 25) each in thermal contact with one of the supports (15, 16);
   wherein the lower face (22) of each of the heat diffusers (19) is parallel to the support circuit board (11) when installed in operation, facing the thermal conduit (18);
   wherein the support circuit board (11) is thermally coupled with the bottom face (22) of all of the heat diffusers (19);

wherein the thermal conduits (18) are mechanically and thermally directly connected with the supports (15, 16);

wherein each of at least two of the heat diffusers (19) is parallel and in thermal contact with two different and adjacent DIMM storage modules (13) by the respective side faces (23a, 23b);

wherein the sockets (12a, 12b, 12c) of the support circuit board (11) comprise two head sockets (12a, 12b) and intermediate sockets (12c); the sockets (12a, 12b, 12c) forming a series of sockets mutually aligned between the head sockets (12a, 12b); the electronic circuit board (10) comprising two cooled containment elements (26, 27) fixed to the support circuit board (11) and each adjacent to one of the head sockets (12a, 12b); wherein the wedge-shaped or L-shaped elements (28, 29) are inserted between one of the containment elements (26, 27) and one of the heat diffusers (19) which is coupled to one of the storage modules (13) which engages a corresponding one of the head sockets (12a, 12b), in such a way as to compact a central part of the heat diffusers (19) by means of the cooled containment elements (26, 27), increasing the dissipation of heat in particular in a central zone of the heat diffusers (19).

2. The electronic circuit board (10) according to claim 1, further comprising threaded elements (30) fixating the wedge-shaped or L-shaped elements (28, 29) to the containment elements (26, 27).

3. The electronic circuit board (10) according to claim 1, wherein the space between the electronic components of two adjacent storage modules (13) is occupied by the walls of two of the heat diffusers (19) which are respectively coupled to the adjacent storage modules (13).

4. The electronic circuit board (10) according to claim 1, wherein the heat diffusers (19) are pushed against the thermal conduits (18).

5. The electronic circuit board (10) according to claim 4, further comprising threaded elements (31) fixating the heat diffusers (19) to the supports (15, 16).

6. The electronic circuit board (10) according to claim 2, further comprising deformable thermally conductive mats (32) installed between the walls (20, 21) of two adjacent heat diffusers (19) and/or between the walls (20, 21) and the thermal conduits (18), to form a thermal bridge between them.

7. The electronic circuit board (10) according to claim 1, wherein the supports (15, 16) have plates passed through internally by the channels (17) and/or heat exchangers of the roll-bond type.

8. The electronic circuit board (10) according to claim 2, wherein the heat diffusers (19) consist of two complementary bodies (19a, 19b) coupled in such a way as to define between them a cavity housing one of the storage modules (13); the bodies (19a, 19b) being in thermal contact at least at the longitudinal ends (24, 25).

9. The electronic circuit board (10) according to claim 5, wherein the threaded elements (31) deforms thermally conductive mats (32) to operate in compression for improving thermal transmission between the heat diffusers (19) and the supports (15, 16).

* * * * *